Dec. 22, 1970 R. H. COLLINS ET AL 3,549,368

PROCESS FOR IMPROVING PHOTORESIST ADHESION

Filed July 2, 1968

INVENTORS
ROBERT H. COLLINS
FRANK T. DEVERSE

BY

Sughrue, Rothwell, Mion, Zinn & Macpeak
ATTORNEYS

United States Patent Office 3,549,368
Patented Dec. 22, 1970

3,549,368

PROCESS FOR IMPROVING PHOTORESIST ADHESION

Robert H. Collins, Poughkeepsie, and Frank T. Deverse, Wappingers Falls, N.Y., assignors to International Business Machines Corporation, Armonk, N.Y., a corporation of New York Filed July 2, 1968, Ser. No. 742,025
Int. Cl. G03c 5/00
U.S. Cl. 96—35.1 10 Claims

ABSTRACT OF THE DISCLOSURE

A method for applying a photoresist to a substrate whereby said photoresist is adherently bound to said substrate by means of a hexa-alkyldisilazane adhesive.

BACKGROUND OF THE INVENTION

Field of the invention

This invention relates generally to a method for coating a substrate and, more particularly, to a method for applying a photoresist material to an oxide surface, such as a silicon dioxide substrate.

Description of the prior art

In the fabrication of a variety of articles, it is often necessary to protect selected areas of an oxide surface while other areas of the same surface are being exposed to further treatments and/or further process procedures. For example, in the fabrication of semiconductor devices, wherein an oxide coating is formed on a semiconductor substrate, it is often necessary to remove selected portions of the oxide coating so as to permit diffusion of a suitable impurity through the oxide layer into the underlying semiconductor substrate. Typical of such techniques is the fabrication of semiconductor devices, such as NPN and PNP single crystal field effect transistors. This type of device is formed by vapor diffusing a suitable impurity into a wafer of a single silicon crystal to form suitable P-type and N-type junctions therein. In order to provide distinct P and N junctions, however, which are necessary for the proper operation of the device, diffusion should occur through only a limited portion of the substrate. Normally, this is accomplished by masking the substrate with a diffusion resistant material such as silicon dioxide which is formed into a protective mask to prevent diffusion through the selected regions of the substrate. The silicon dioxide mask is typically provided by forming a uniform oxide layer over the wafer substrate and thereafter creating a series of openings through the oxide layer which allow the passage of the impurity directly into the underlying surface within a limited area. These openings are readily created by coating the oxide with a material known as a photoresist, a material capable of polymerizing and insolubilizing on exposure to light. The photoresist coating is selectively exposed to light, causing polymerization to occur above those regions of the oxide which are intended to be protected during the subsequent diffusion. The unpolymerized or unexposed portions of the photoresist are removed by a solvent which is inert to the polymerized portion of the resist and a suitable etchant for silicon dioxide, such as hydrogen fluoride, is applied to remove the unprotected oxide regions.

It has been observed, however, that upon exposure of the masked silicon dioxide surface to the etchant, the photoresist coating tends to curl away from the oxide surface permitting severe undercutting of the layer immediately beneath the edges of the protective photoresist, exposing additional areas of the silicon substrate to the impurity diffusion and creating deleteriously indistinct P- and N-type junctions. The resulting semiconductor device is therefore characterized by a significantly decreased output relative to that which should theoretically be provided. Moreover, since in field effect transistors, at least two openings must be created through the oxide surface, corresponding to the source and drain of the device, there are at least four edges whose lack of resolution will influence the width of the source and drain and, more importantly, the width of the gate lying between the source and drain. Furthermore, since the impurity tends to spread after entering the wafer body and since two separate diffusion regions are being generated simultaneously, the probalility of shorting within the device, especially if narrow gate widths are desired becomes increasingly more probable as the lack of resolution increases.

Recognizing this problem, the art first proposed heating the photoresist prior to etching, such as by post-baking, with the hope of providing a more adherent bond between the oxide surface and the resist so as to prevent the "curling" or lifting effect to which the lack of resolution seems to be attributable. Post-baking, however, has not proved to be an altogether satisfactory technique because its effectiveness is largely dependent on the particular oxide substrate being treated and on the surface conditions of the oxide layer, whether it contains impurities, such as phosphorous pentoxide, or water moisture. Moreover, the normal variations in the oxide thickness results in certain layers being exposed to the etching solution longer than others, thereby accentuating the degree of resist curling or lifting, and requiring a greater degree of post-baking in some regions than in others for the same substrate. Not only is post-baking a more unreliable means for bonding a photoresist to an oxide surface, but after treating the selected portions of the surface, the post-baked resist is often more difficult to remove. Post-baking cannot, therefore, be used as a routine procedure. It has now been determined that a more advantageous method for preventing resolution losses is to precoat the oxide surface with an adhesive composition which will adherently bond the photoresist to the oxide substrate. While several adhesive coating compositions have been proposed heretofore, none have proved to be entirely satisfactory. Those having suitable bonding abilities are generally toxic, highly reactive with air and moisture and often require some degree of post-baking.

Although the problems of treating oxide surfaces with coatings of photoresist have been described principally in terms of the formation of semiconductor devices, the same problems have been found to occur in the formation of other types of articles as well, principally in those articles in which an oxide surface is selectively etched.

It is, therefore, an object of this invention to provide a method for coating a substrate with a photoresist layer. It is further an object of this invention to provide a photoresist mask for etching of an oxide coating which will not curl or lift from the etched regions. Another object is to eliminate baking of the photoresist layer prior to etching. A still further object is to provide a semiconductor device having a high degree of resolution in the source and drain regions. These and other objects are obtained herein by the following procedure.

SUMMARY OF THE INVENTION

It has now been found that a photoresist material may be firmly and adherently bound to an oxide substrate by means of an adhesive composition which prevents "curling" or lifting of the photoresist from the substrate and consequently prevents undercutting of the oxide during etching. This technique can be essentially adapted for fabricating semiconductor devices having a high output capability and having a high degree of gate and source resolution. More particularly, it has been found that a superior, more adherent photoresist mask can be provided by adhesively bonding the photoresist to the oxide layer with a coating of hexa-alkyldisilazane.

DETAILED DESCRIPTION OF THE PREFERRED EMBODIMENTS

Figure 1:
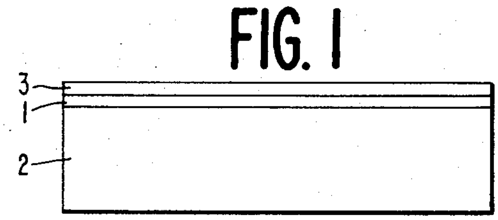
FIGS. 1 to 8 illustrate the sequence for fabricating field effect transistors according to the process of the present invention. For simplicity only an MOS type field effect transistor has been depicted.

According to this invention, a photoresist layer is formed on an oxide substrate by adherently bonding said photoresist to said substrate by means of a hexa-alkyldisilazane adhesive. To illustrate this invention, reference can be made to the fabrication of semiconductor devices in which an oxide layer 1 is provided on a single crystal silicon wafer substrate 2 of FIG. 1. The oxide can be formed by any well known state of the art technique, such as evaporation of silicon dioxide onto the silicon substrate, thermal oxidation of the silicon surface with oxygen, water moisture, air or other oxidizing medium or by the thermal decomposition of siloxane or the like. The thickness of the oxide may vary from a few hundred angstroms to many hundreds of thousands of angstroms, depending upon the particular oxidation step or particular purpose for which the oxide is formed.

One good method for forming the oxide surface is by oxidation of the silicon substrate with oxygen at a temperature of about 10 to 50° C. by flowing two liters per minute of oxygen past a 3 to 5 micron silicon wafer for about 16 hours. After the oxide layer is formed, a thin coating 3 of hexa-alkyldisilazane adhesive, such as hexamethylenedisilazane is applied thereto. The adhesive can be applied full strength or can be applied in admixture with a diluent such as trifluorotrichloroethane.

The adhesive can be applied by any one of several common coating techniques. For example, the adhesive may be applied by spray spinning, whereby a quantity of the resist is coated onto the wafer and the wafer is subjected to centrifugal force at speeds of from 3000 to 6000 r.p.m. Alternatively, the adhesive may be applied by dipping or immersing the wafer into a solution of the adhesive. Another good method is to subject the wafer to an atmosphere of the vaporized adhesive for a period of time and at a temperature sufficient to cause the desired thickness to adhere to the wafer.

In general, for the purposes of this illustration, the hexaalkyldisilazane adhesive need only be coated onto the wafer to a thickness of up to several angstroms and preferably only to a molecular layer thickness.

A suitable photoresist material 4 is then applied over the adhesive layer 3. A wide variety of photoresist coatings can be adherently bound by the techniques of this invention. Among those resists found to be especially suitable include the compositions based on polyvinyl cinnamate, polyisoprene, natural rubber resins, formaldehyde novolaks, cinnamylidene or polyacrylic esters. Examples of these photoresists include commercially available KPR–2, a polyvinyl cinnamate based composition having a molecular weight of from 14,000 to 115,000, KTFR, a partially cyclized polymer of cis-1,4-isoprene having an average molecular weight of from 60,000 to 70,000; KMER, a natural rubber resin based composition; Shipley AZ–1350, an m-cresol formaldehyde novolak resin composition; and KOR, a cinnamylidene or poly-β-styril acrylic ester coating composition. These photoresists normally contain small amounts of a photoinitiator or a photosensitizer which decomposes under the action of ultraviolet light to yield a free radical species which initiates the polymerization reaction. Especially suitable photoinitiators, well known in the art, include the azides, such as 2,6-bis (p-azidobenylidene)-4-methylcyclohexanone, the diazo oxides, such as 1-oxo-2-diazo-5-sulfonate ester of naphthalene and the thioazo compounds, such as 1-methyl-2-m-chlorobenzoylmethylene-β-naphtho-thiazoline, as disclosed in U.S. Pat. 2,732,301.

Figure 2:
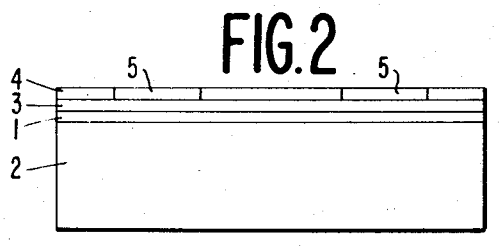
Figure 3:
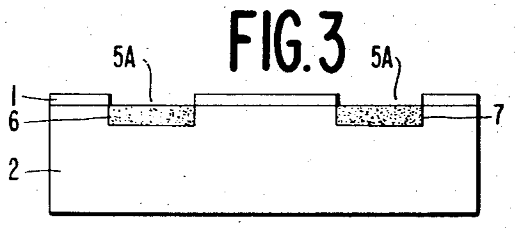

The thickness of the photoresist to be applied depends upon the particular photoresist used and upon the particular technique and purpose for applying the photoresist. Normally, thicknesses between 8,000 and 20,000 A. are adequate. The photoresist layer is subjected to a suitable light pattern so as to cause selective polymerization which provides a source-drain pattern 5 of FIG. 2 on the silicon dioxide layer. While the spacing between the source and the drain was previously limited by the amount of undercutting of the oxide film occurring during etching, by the present technique, the gate and source can be spaced at a much closer distance with the only limitation being the degree to which the impurity will tend to spread after it enters the silicon body. The unpolymerized regions of the photoresist are then removed with a suitable solvent, such as methylene chloride or the like, and the surface of the wafer is subjected to an oxide etchant solution. Suitable etchant solutions include buffered hydrogen fluoride, ammonium chloride, nitric acid, mixtures of nitric acid, acetic acid and hydrofluoric acid, and the like, which provide the gate and source openings 5A of FIG. 3. It was noted that during etching the photoresist coating remained firmly bound to the oxide surface and that curling and undercutting of the oxide surface was virtually eliminated.

Figure 6:
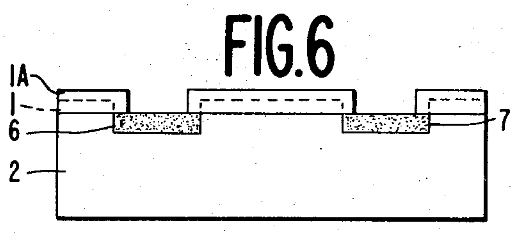
Figure 7:
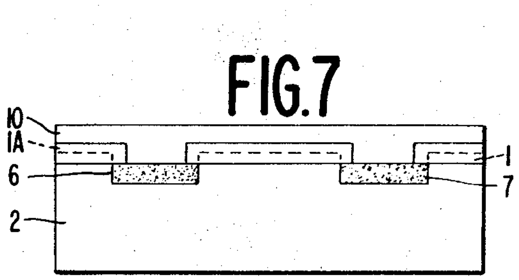
Figure 8:
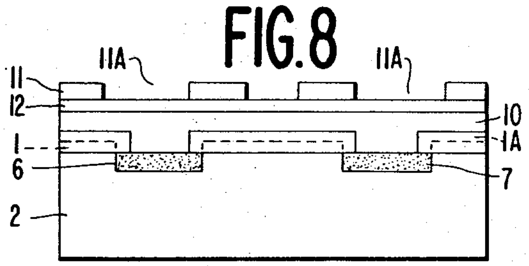
Figure 4:
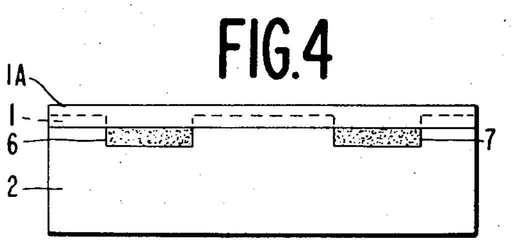
Figure 9:
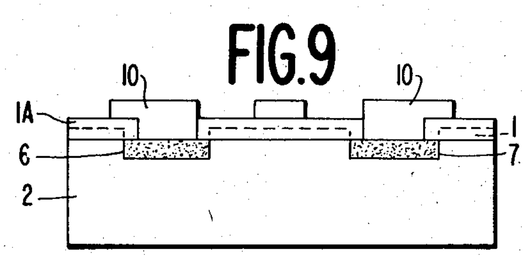
Figure 5:
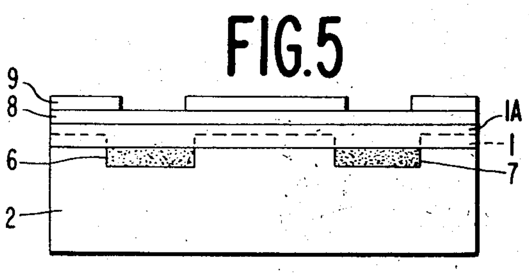

An N- or P-type diffusion can be conducted with phosphorous, arsenic, antimony, boron, aluminum, gallium, or indium to form the source 6 and drain 7 regions with an oppositely charged region between them, which will subsequently become the gate or the conductor channel. If boron P-type is selected as the dopant, diffusion can be conducted using boron trioxide at 1250° C. for about four hours, thereby forming the drain, source and gate. A second layer 1A of silicon dioxide of about 1,000 to 5,000 angstroms thickness may be deposited over the surface as depicted in FIG. 4. For purposes of continuity, the two silicon dioxide layers 1 and 1A are differentiated from each other, although in actuality they are continuous. A coating of hexa-alkyldisilazane 8 is again applied over the silicon dioxide layer and the photoresist layer 9 is formed over the adhesive in the manner shown in FIG. 5. The silicon dioxide in the open portions of the pattern are etched as previously described with buffered hydrogen fluoride and the photoresist removed which results in the device shown in FIG. 6. Aluminum 10 is evaporated over the entire surface, resulting in the structure shown in FIG. 7 and another layer of photoresist 11 is deposited and developed as shown in FIG. 8. After developing the resist, the aluminum in the open portions of the photoresist pattern 11*a* is etched with a sodium hydroxide solution resulting in the structure shown in FIG. 9. It will be noted that the aluminum directly contacts the source and drain regions but that it is insulated from the gate by silicon dioxide as in conventional field effect structures. These latter structures are commonly referred to as insulated gate field effect transistors, designated as FET. Such structures are useful as interconnected isolated devices or integrated devices in computer logic circuits.

While this invention has been described principally in terms of preparing semiconductor devices, it should be understood that it has general applicability to any process which requires adhering a photoresist to any oxide surface. For example, the techniques of this invention can be used for preparing printed circuit boards, flat film memory units, wherein a thin film is protected by an oxide surface, double layer modules, gravure printing, wherein an oxide base is involved, preparation of photomasks in general for glass plates and many others.

While it is not fully understood, it is believed that the disilazene in the adhesive reacts with the oxide of the surface while the photoresist tends to adhere strongly to the remaining portions of the molecule. This adhesive has general applicability, therefore, and is generally effective for adhering a photoresist to an oxide surface, such as silicon dioxide, silicon monoxide, aluminum oxide, thorium oxide, sulfur oxide, copper oxide, beryllum oxide, titanium oxide, zinc oxide, nickel oxide and cobalt oxide, to mention only a few.

To further illustrate the present invention, the following examples will be referred to. It should be clearly understood, however, that these examples are not intended to be limiting in any manner, except as specified in the appended claims.

Example 1.—Fifty parts of hexamethyldisilazane were admixed with 50 parts of trifluorotrichloroethane. A 3 to 5 micron silicon dioxide wafer having a diameter of about 1¼ inches was covered with the hexamethyldisilazane solution. After allowing the wafer to stand for about 30 seconds the wafer was subjected to centrifugal force by rotating it at 4000 r.p.m. for about 15 seconds. A KTFR photoresist composition with about 6% di-n-butyl adipate was applied to about ¾ of the front side of the wafer surface. The wafer was again subjected to centrifugal force by being rapidly spun to about 4000 r.p.m. for about 15 seconds. The wafer was thereafter pre-baked for 10 minutes at a temperature of about 100° C. so as to improve the sensitivity of the photoresist and to dry any excess organic vehicle. The resulting photoresist layer was found to be about 8000 A. After exposing the wafer to light and developing, the wafer was subjected to an etching solution for the further preparation of semiconductor devices. The photoresist was found to be adherently bound to the oxide surface and showed no tendency to curl or lift from the surface during etching.

Similar results are obtainable by admixing the photoresist with the adhesive and applying the mixture to the oxide surface in a single step rather than in multiple steps as described in Example 1.

Generally comparable results are obtainable with any hexa-alkyldisilazane adhesive wherein the alkyl group is lower alkyl, such as methyl, ethyl or propyl.

To show the surprisingly superior bonding characteristics of the adhesive of the present invention, hexamethyldisilazane was compared with other art recognized adhesives, principally the chlorosilanes, which were previously thought to be good adhesives for bonding photoresist type materials to an oxide layer. Accordingly, hexamethyldisilazane was compared with dimethylchlorosilane, trimethylchlorosilane, dimethyldichlorosilane and phenoltrichlorosilane with the results as outlined in Table 1.

TABLE I

| | Chloro-silanes | Hexamethyldisilazane |
|---|---|---|
| Average undercutting in silicon dioxide | 120 mm | 0. |
| Capable of being applied by dipping | No | Yes. |
| Pinhole formation | Large amount of pinhole formation. | Very little pinholing. |
| Toxicity | Highly toxic | Very low toxicity. |
| Corrosiveness | Very corrosive, emitting HCl. | Not corrosive. |
| Degree of post baking required to obtain good adhesion between photoresist and silicon dioxide substrate. | Generally about 15 min. at 100 to 150° C. | None. |
| Length of time in which photoresist will be firmly adhered to the oxide. | Several hours | Several weeks. |

Having generally described the invention what is claimed and intended to be covered by Letters Patent is:

1. A method for bonding a photoresist material to an oxide surface which comprises applying said photoresist to said oxide surface with a hexa-alkyldisilazane containing adhesive.

2. A method of claim 1 wherein said oxide substrate is a silicon oxide substrate.

3. The method of claim 1 wherein said hexa-alkyldisilazane is hexamethyldisilazane.

4. The method of claim 1 wherein said hexa-alkyldisilazane is hexaethyldisilazane.

5. The method of claim 1 wherein said photoresist material is selected from the group consisting of those photoresists containing polyvinyl cinnamate, polyisoprene, natural rubber resins, formaldehyde novolaks, cinnamylidene and polyacrylic esters.

6. The method of claim 1 wherein said photoresist material is a partially cyclized polymer of cis-1,4-isoprene having an average molecular weight of 60,000 to 70,000 and containing an azide photoinitiator.

7. The method of claim 1 wherein the oxide surface is precoated with said hexa-alkyldisilazane adhesive and said photoresist is applied to said adhesive.

8. The method of claim 1 wherein said hexa-alkyldisilazane adhesive is admixed with said photoresist and the admixture is simultaneously applied to said oxide surface.

9. In a method for fabricating semiconductor devices whereby an impurity is diffused into a single crystal silicon through a silicon dioxide mask, the improvement comprising forming said dioxide mask by forming a silicon dioxide coating onto said silicon substrate, coating a hexa-alkyldisilazane adhesive onto said dioxide surface, forming a photoresist layer on said adhesive, exposing and developing said photoresist and etching said dioxide through said photoresist so as to form said dioxide mask.

10. The method of claim 9 wherein said photoresist is selected from the group consisting of those photoresist materials containing polyvinyl cinnamate, polyisoprene, natural rubber resins, formaldehyde novolaks, cinnamylidene and polyacrylic esters.

References Cited

UNITED STATES PATENTS

| | | | |
|---|---|---|---|
| 3,163,534 | 12/1964 | Adams et al. | 96—75 |
| 3,398,210 | 8/1968 | Plueddemann et al. | 260—827 |
| 3,405,017 | 10/1968 | Gee | 96—36.2X |
| 3,482,977 | 12/1969 | Baker | 96—36.2 |

OTHER REFERENCES

Schwartz, G. G.; "IBM Technical Disclosure Bulletin," vol. 9, No. 1, June, 1966, p. 10.

Conture, R. A., et al.; "IBM Technical Disclosure Bulletin," vol. 10, No. 7, December 1967.

RONALD H. SMITH, Primary Examiner

U.S. Cl. X.R.

96—36.2, 115; 156—17